United States Patent
Lazar, II et al.

(10) Patent No.: US 9,217,765 B2
(45) Date of Patent: Dec. 22, 2015

(54) METHOD AND SYSTEM FOR ISOLATING VOLTAGE SENSOR AND CONTACTOR FAULTS IN AN ELECTRICAL SYSTEM

(75) Inventors: Walter M. Lazar, II, Howell, MI (US); Daniel P. Grenn, Highland, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 648 days.

(21) Appl. No.: 13/570,319

(22) Filed: Aug. 9, 2012

(65) Prior Publication Data

US 2014/0046534 A1 Feb. 13, 2014

(51) Int. Cl.
*B60L 3/04* (2006.01)
*G01R 31/02* (2006.01)
*G01R 35/00* (2006.01)

(52) U.S. Cl.
CPC ............... *G01R 31/025* (2013.01); *B60L 3/04* (2013.01); *G01R 35/00* (2013.01)

(58) Field of Classification Search
CPC ......... B60L 3/04; B60L 1/00; B60L 11/1859; G01R 31/025; G01R 31/3606; G01R 31/3658; H02H 3/027; H02H 3/202; B60K 6/28; B60K 6/46; H01M 10/482
USPC ..................... 701/22, 33.9; 324/509, 30, 433; 320/167; 361/23, 52; 429/92
See application file for complete search history.

(56) References Cited

U.S. PATENT DOCUMENTS

| | | | |
|---|---|---|---|
| 7,642,755 B2* | 1/2010 | Bartilson | 320/167 |
| 8,168,315 B1* | 5/2012 | Hermann | 429/92 |
| 2006/0087775 A1* | 4/2006 | Osawa | 361/23 |
| 2010/0110594 A1* | 5/2010 | Walters et al. | 361/52 |
| 2011/0202220 A1* | 8/2011 | Seta et al. | 701/22 |
| 2011/0304339 A1* | 12/2011 | Schumacher et al. | 324/509 |
| 2012/0194199 A1* | 8/2012 | Mizoguchi | 324/433 |
| 2013/0027049 A1* | 1/2013 | Sukup | 324/430 |

* cited by examiner

*Primary Examiner* — Tuan C. To
*Assistant Examiner* — Yuri Kan
(74) *Attorney, Agent, or Firm* — Quinn Law Group, PLLC

(57) ABSTRACT

A method for isolating voltage sensor errors from contactor errors in an electrical system includes measuring a voltage between ground and a voltage bus rail when a contactor is open, and comparing the measured voltage to a first threshold voltage corresponding to a calibrated voltage reading that is expected when the contactor is closed. A first diagnostic code is recorded with a stuck-in-range status for the sensor when the measured voltage is greater than 0 and less than the first threshold voltage. A second diagnostic code is recorded with a stuck-closed status for the contactor when the measured voltage is equal to the first threshold voltage. The measured voltage may be compared to a second threshold voltage that exceeds the first threshold voltage, with a third diagnostic code recorded with a shorted value for the sensor when the measured voltage exceeds the first threshold voltage or is less than 0.

13 Claims, 2 Drawing Sheets

METHOD AND SYSTEM FOR ISOLATING VOLTAGE SENSOR AND CONTACTOR FAULTS IN AN ELECTRICAL SYSTEM

TECHNICAL FIELD

The present disclosure relates to a method and a system for isolating voltage sensor and contactor faults in an electrical system.

BACKGROUND

In hybrid electric and battery electric vehicles, a high-voltage DC battery pack provides some of the power necessary for propelling the vehicle. The battery pack energizes an inverter module over a high-voltage DC bus. The inverter module converts the DC voltage from the battery pack into an AC waveform, and thereafter energizes one or more motor/generator units over a high-voltage AC bus with the AC waveform. Torque from the motor/generator unit(s) may be used thereafter to provide input torque to a transmission or to generate electricity for recharging the battery pack.

The battery pack can be electrically isolated from the vehicle chassis and electrical components of the vehicle powertrain in part by selectively opening solid-state contactors under certain operating conditions, for instance upon vehicle shutdown or in the presence of a detected electrical fault. The conductive leads of one or more of the contactors can become stuck or welded closed. However, voltage sensors used for detecting a welded contactor condition can fail, thereby complicating the diagnosis and isolation of welded contactor and stuck-in-range voltage sensor faults.

SUMMARY

A method is disclosed herein for isolating an electrical fault in an electrical system. The system may be a high-voltage (HV) vehicle such as a hybrid, extended-range, or battery electric vehicle, or any other electrical system using a battery pack, an electrical load, and a contactor that selectively connects/disconnects the battery pack from the electrical load.

The method includes measuring, via a voltage sensor, a voltage between ground and a conductive rail of a voltage bus in an electrical system having a voltage source and an electrical load that is selectively connectable to the voltage source via a contactor. The method also includes receiving the measured voltage from the voltage sensor using a controller when the contactor is open, then comparing the received measured voltage signal to a first threshold voltage that corresponds to an expected voltage reading of the voltage sensor when the contactor is closed.

A first diagnostic code is recorded in a memory device of the controller, with a stuck-in-range failure status for the voltage sensor, when the received measured voltage signal is greater than 0 and less than the first threshold voltage. A second diagnostic code is recorded in the memory device, with a stuck-closed status for the contactor, when the received voltage signal is equal to the first threshold voltage.

The method may include recording a third diagnostic code in the memory device, with a shorted value for the voltage sensor, when the received measured voltage exceeds the first threshold voltage or is less than 0.

A system is also disclosed herein that includes a voltage source, a voltage bus, a contactor, an electrical load, a voltage sensor, and a controller. The electrical load is selectively connected to and disconnected from the voltage source over the voltage bus via the contactor. The voltage sensor is configured to measure a voltage between the voltage bus and electrical ground. The controller receives the measured voltage from the voltage sensor when the contactor is open, and then compares the received measured voltage to a first threshold voltage that corresponds to an expected voltage reading when the contactor is closed.

The controller also records a first diagnostic code, with a stuck-in-range failure status for the voltage sensor, when the received measured voltage is greater than 0 and less than the first threshold voltage. A second diagnostic code, with a stuck-closed status for the contactor, is recorded in the alternative when the received measured voltage is equal to the first threshold voltage.

Additionally, a vehicle includes a battery pack, a transmission, a motor/generator unit connected to the transmission, a voltage bus having a positive and a negative rail, and a pair of contactors, with a first contactor connected to the positive rail and a second contactor connected to the negative rail. The vehicle also includes a power inverter module that is selectively connected to and disconnected from the battery pack over the voltage bus via the pair of contactors, a first voltage sensor that measures a voltage between electrical ground and the positive rail, a second voltage sensor that measures a voltage between electrical ground and the negative rail, and a controller. The controller executes the method noted above to isolate failures of the voltage sensors from failures of the contactors.

The above features and advantages and other features and advantages of the present invention are readily apparent from the following detailed description of the best modes for carrying out the invention when taken in connection with the accompanying drawings.

DETAILED DESCRIPTION

Figure 1:
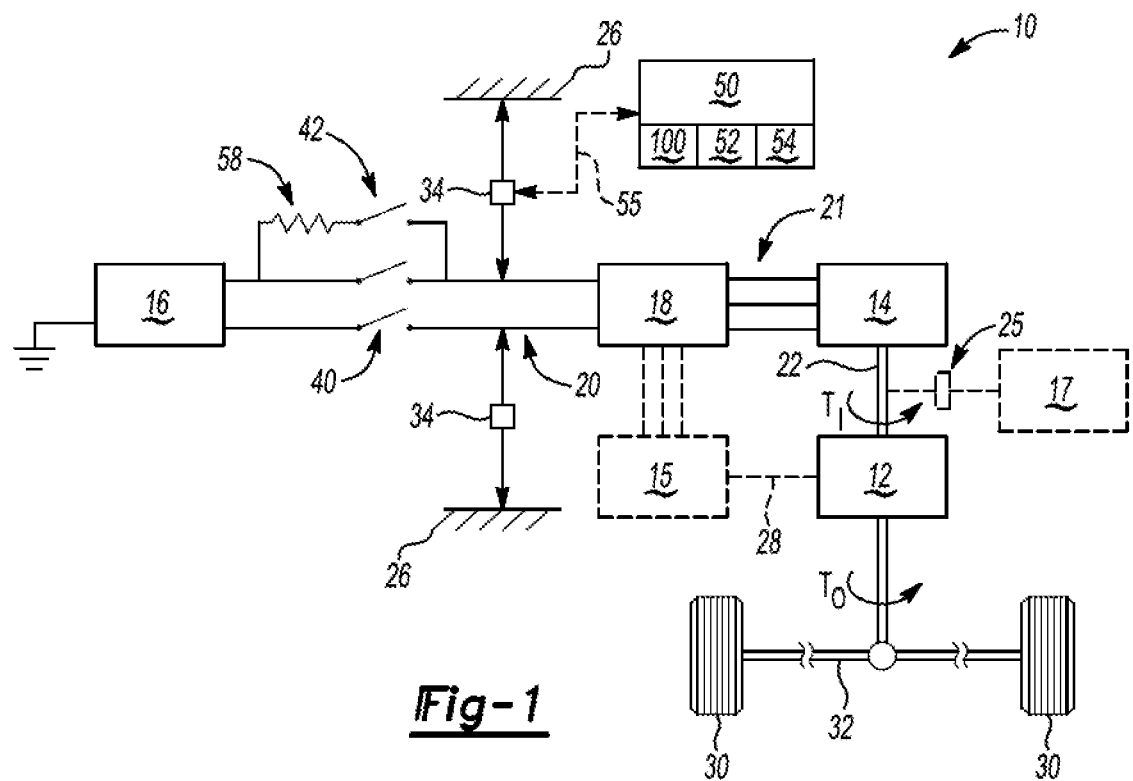
FIG. 1 is a schematic illustration of an example vehicle having a controller that isolates a voltage sensor fault from a contactor fault.

Referring to the drawings, wherein like reference numbers refer to like components, and beginning with FIG. 1, an example vehicle 10 is shown that includes a voltage source in the form of a battery pack 16, voltage sensors 34, a set of solid-state contactors 40, and a controller 50. As described in detail below with reference to FIGS. 2-4, the controller 50 is configured to selectively execute steps of a method 100 to isolate high-voltage electrical faults aboard the vehicle 10, specifically a "stuck-in-range" fault of the voltage sensors 34 and a "stuck-closed" fault of the contactors 40. The method 100 may be used in any electrical system employing a voltage source, whether a battery, fuel cell, capacitor, or other electrical or chemical voltage supply, that is disconnected from an electrical load via activation of a mechanical/solid-state switch, relay, or contactor like the contactors 40 described herein. However, for illustrative consistency the example vehicle 10 will be explained in the examples that follow.

The vehicle 10 includes at least one motor/generator unit (MGU) 14 having a motor output shaft 22. The motor output shaft 22, which is coupled to a transmission 12, delivers input torque (arrow $T_I$) to the transmission 12 as needed for powering the vehicle 10. The transmission 12 may include one or more simple or compound planetary gear sets connected via one or more clutches to a final drive assembly (not shown). Output torque (arrow $T_O$) from the transmission 12 is ultimately delivered to a set of drive wheels 30 via a drive axle 32.

Depending on the embodiment, other power sources may be used, such as another MGU 15 with a motor output shaft 28 and/or an internal combustion engine 17, both of which are shown in phantom in FIG. 1. When the engine 17 is used as part of the powertrain, an input damping clutch 25 may be used to selectively connect or disconnect the engine 17 from the driveline, and to dampen driveline vibration, e.g., in conjunction with an engine restart event.

The battery pack 16 is electrically connected to a power inverter module (PIM) 18 via a high-voltage DC bus 20 and the contactors 40. In turn, the PIM 18 is electrically connected to the MGU(s) 14 and/or 15 via a high-voltage AC bus 21. As used herein, the term "high voltage" refers to a voltage level in excess of the auxiliary/12 VDC voltage levels normally used to power auxiliary vehicle systems such as audio systems, lighting, and the like. The battery pack 16 may be rated for approximately 60 VDC to over 300 VDC. In some configurations the battery pack 16 may store 300 VDC or more. The PIM 18 may be controlled via pulse-width modulation and high-speed semiconductor switching, as is well understood in the art, to convert AC power from the MGU(s) 14 and/or 15 into DC power suitable for storage in the battery pack 16, and to convert stored DC power to AC power as needed for powering the MGU(s) 14 and/or 15.

To facilitate pre-charging of the PIM 18, i.e., to ensure charge balancing between the battery pack 16 and the PIM 18 prior to closing the contactors 40, a resistor 58 and an additional contractor 42 may be placed in electrical parallel with the contactors 40 as shown. The controller 50 can close the additional contactor 42 prior to closing the contactors 40, with the resistor 58 limiting the rate of current flow into the PIM 18, as will be readily appreciated by one of ordinary skill in the art. Additional contactors (not shown) may be present in the vehicle 10 as needed between a given electrical load and the battery pack 16 or any other voltage source, e.g., a fuel cell.

The contactors 40 and any other contactors used aboard the vehicle 10 may be variously embodied as single-pole, single-throw relay devices, as solid-state switches, or as any other physical switching device. Under certain conditions, the contactors 40 may fail in such a manner as to not open or break their respective electrical connections when commanded to do so. For example, a mechanical failure such as a broken spring may prevent the contactor 40 from opening. Likewise, an electrical fault or a control fault could force one of the contactors 40 to either open or close with an excessive or incorrect load across its terminals, which in turn could lead to a welded contactor or other "stuck-closed" contactor condition.

Additionally, the voltage sensors 34 may experience a stuck-in-range fault, or may simply fail to work at all. Diagnosis of the voltage sensors 34 depends on the properly diagnosed open/closed state of the contactors 40. However, the accurate detection of an open/closed state of the contactors 40 depends on the validity of the voltage measurements provided by the voltage sensors 34. The present method 100, as executed by the controller 50, therefore allows the controller 50 to distinguish a stuck-in-range failure of the voltage sensors 34 from a stuck-closed fault of the contactors 40 using the same measured voltage signals (arrows 55) as provided by the voltage sensors 34.

With respect to the controller 50 shown in FIG. 1, this hardware/software device receives the voltage signals (arrows 55) over a controller area network (CAN) bus or other suitable communications channel, and then executes recorded instructions or code embodying the method 100 from a tangible, non-transitory memory device 54. Execution of the method 100 allows a processor 54 to perform the various required calculations and threshold comparisons as explained in detail below with reference to FIGS. 2-4.

The controller 50 may be configured as a digital computer having the processor 52 and memory device 54 as two of its main components. The memory device 54 maybe embodied as read only memory (ROM), flash memory, or other suitable magnetic or optical storage media. The controller 50 may also include any required amount of transitory memory such as random access memory (RAM) and electrically-erasable programmable read only memory (EEPROM). Other components may include a high-speed clock, analog-to-digital (A/D) and digital-to-analog (D/A) circuitry, and input/output circuitry and devices (I/O), as well as appropriate signal conditioning and buffer circuitry.

Figure 2:
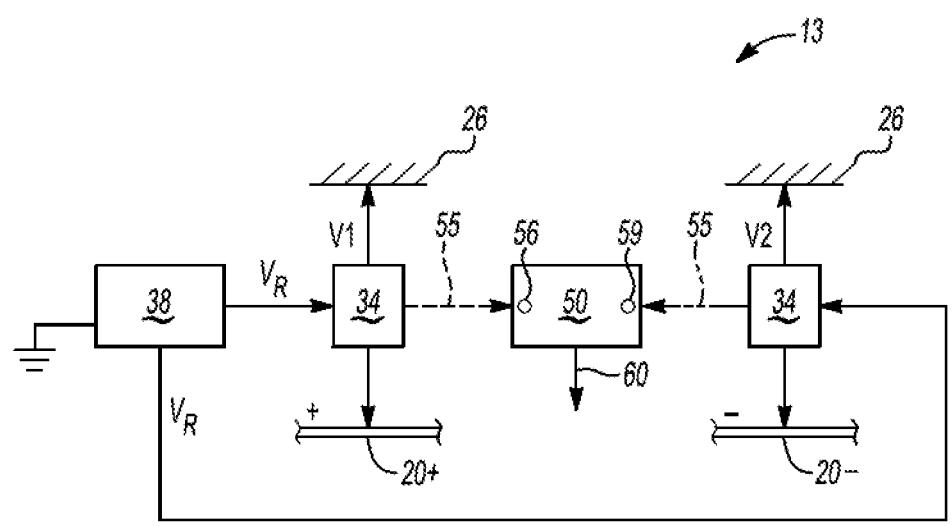
FIG. 2 is a schematic illustration of a control circuit that can be used within the vehicle shown in FIG. 1.

Referring to FIG. 2, an example control circuit 13 includes an auxiliary voltage source 38, as well as the voltage sensors 34 and the controller 50 noted above with reference to FIG. 1. The auxiliary voltage source 38 provides a reference voltage (arrow $V_R$), e.g., 5 VDC. The auxiliary voltage source 38 may be configured as a DC battery or as a reduced-voltage DC output from a DC-DC converter (not shown). One voltage sensor 34 is used per conductor or rail of the high-voltage DC bus 20 shown in FIG. 1, with the rails 20+ and 20− representing the respective positive and negative rails of the high-voltage DC bus 20. In some embodiments, only one voltage sensor 34 and only one conductive rail may be used. While the use of dual positive and negative rails 20+, 20− provides a current path in the event of a stuck-closed fault of one of the rails 20+ or 20−, and thus retention of some level of electrical functionality relative to a single rail embodiment, execution of the present method 100 proceeds in the same manner regardless of the number of rails that are used.

The reference voltages (arrows $V_R$) as shown in FIG. 2 drive the voltage sensors 34. When two voltage sensors 34 are used as shown, one voltage sensor 34 reads a first voltage (V1) between electrical ground, e.g., the chassis ground 26, and the positive rail 20+ while the other voltage sensor 34 reads a second voltage (V2) between the chassis ground 26 and the negative rail 20−. The chassis ground 26 in a non-vehicular embodiments may be any grounded component of a given system being diagnosed via the method 100. The voltage sensors 34 transmit their respective measured voltages as voltage signals (arrows 55) to a corresponding pin 56 or 59 of the controller 50, with the first voltage (V1) being transmitted to pin 56 and the second voltage (V2) being transmitted to pin 59. The controller 50 then processes the received voltage signals (arrows 55) and generates a suitable diagnostic output signal (arrow 60) as a control action.

Figure 3:
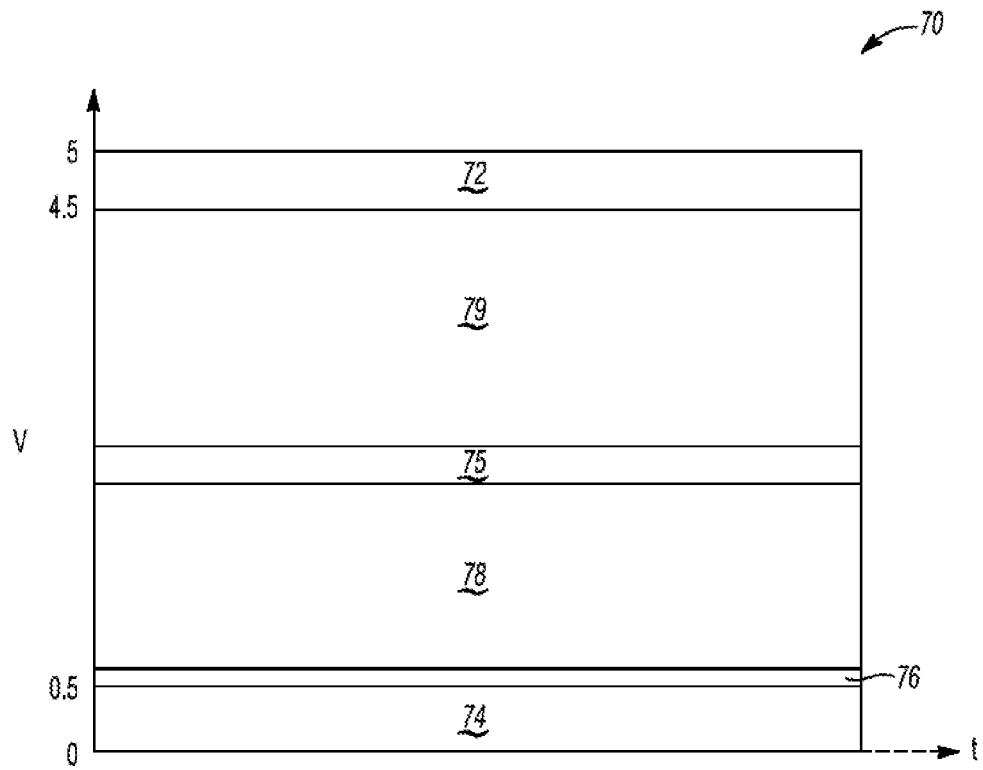
FIG. 3 is a time plot of example DC reference voltages that describes an aspect of the present method for isolating faults using the circuit shown in FIG. 2.

Referring to FIG. 3, a time plot 70 is used to describe an example range of DC voltage outputs from the voltage sensors 34 shown in FIGS. 1 and 2. A typical embodiment is a voltage sensor 34 rated for 5 VDC. In such a design, the DC voltage range is 0-5 VDC, and the reference voltage (arrows $V_R$) of FIG. 2 is 5 VDC. Because the actual voltage rating of the battery pack 16 shown in FIG. 1 can vary with the application, the sensor output range of the voltage sensors 34 is indexed to the actual operating range of the power source.

As an example, the battery pack 16 of FIG. 1 may have a nominal rating of 300 VDC. In this instance, when a single contactor 40 is used for a single bus rail, 4.5 VDC corresponds to 300 VDC and 0.5 VDC corresponds to 0 VDC, leaving a 0.5 VDC voltage offset at the upper and lower ends of the DC voltage range. In the embodiment of FIG. 1 in which the DC bus 20 has two conductive rails 20+ and 20−, each rail carries 50% of the voltage of the battery pack 16, for instance 150 VDC.

The 0.5 VDC voltage offset can be used to diagnose an additional fault condition. Results falling above 4.5 VDC (region 72) or below 0.5 VDC (region 74) respectively correspond to shorted/out-of-range high and shorted/out-of-range low faults for the voltage sensors 34. Regions 78 and 79 correspond to stuck-in-range faults for the voltage sensors 34. Region 75 corresponds to stuck-closed fault of the contactor 40. Region 76 corresponds to a passing diagnostic if a measured value falls in this region when the contactors 40 are open. If a measurement falls within region 76 when the contactors 40 are closed, this corresponds to one of two fault conditions: an open contactor 40 or a stuck-in-range fault for the voltage sensors 34. Placement of a particular measurement in one of these regions is achieved via execution of the method 100, an example of which is now described with reference to FIG. 4.

Figure 4:
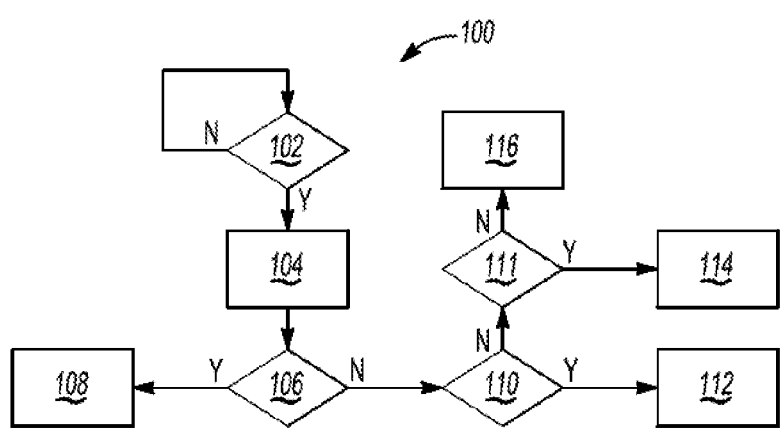
FIG. 4 is a flow chart describing an example method for isolating a voltage sensor fault from a contactor fault in the vehicle shown in FIG. 1.

Referring to FIG. 4 in conjunction with the structure shown in FIGS. 1 and 2, the controller 50 determines at step 102 whether a set of enabling conditions are present for performing voltage fault isolation. Because the contactors 40 are automatically opened when the vehicle 10 is not running, for instance while the vehicle 10 is parked in a garage or while the battery pack 16 is actively charging, step 102 may include detecting whether the vehicle 10 is "awake" or otherwise operating in a state in which the contactors 40 are commanded open. For other configurations evaluating different contactors 40, i.e., at a location other than between the battery pack 16 and the PIM 18 as shown in FIG. 1, the enabling conditions of step 102 may be different. Once suitable enabling conditions have been detected at step 102, the method 100 proceeds to step 104.

At step 104, the controller 50 receives the measured voltage signals (arrows 55) from the voltage sensor(s) 34, temporarily records these values via the memory device 54, and then proceeds to step 106.

At step 106, the controller 50 next determines whether the received voltage measurements (arrows 55) from step 104 is greater than 0 VDC but less than a voltage expected when the contactor 40 is closed, i.e., 50% of the maximum output voltage of the battery pack 16 when dual contactors 40 are used. If so, the method 100 proceeds to step 108. The method 100 also proceeds to step 108 when the received voltage signals (arrows 55) exceed the voltage expected when the contactor 40 is in a closed position. The value when the contactor 40 is closed corresponds, as noted above with reference to FIG. 3, to 4.5 VDC when using a 5 VDC max sensor rating. Thus, values corresponding to the criteria of step 106 fall within the regions 78 and 79 shown in FIG. 3. If neither case applies, the method 100 proceeds in the alternative to step 110.

At step 108, the controller 50 records, via a diagnostic signal (arrow 60) of FIGS. 1 and 2, a diagnostic code having a status indicating that the voltage sensor 34 is stuck-in-range. Suitable control actions may be taken as needed after recording this status, for instance repair or replacement of the voltage sensor(s) 34.

At step 110, the controller 50 determines whether the received voltage signals (arrows 55) from step 104 convey a value that is equal to the voltage expected when the contactor 40 is closed, e.g., 2.25 VDC for a single contactor 40 in the dual contactor configuration of FIG. 1, i.e., region 75 of FIG. 3. If so, the method 100 proceeds to step 112. Otherwise, the method 100 proceeds to step 111.

At step 111, the controller 50 next determines whether an out-of-range high or an out-of-range low value is present. If so, the method 100 proceeds to step 114. Otherwise, the method 100 proceeds to step 116.

At step 112, the controller 50 records, via diagnostic signal (arrow 60) of FIGS. 1 and 2, a diagnostic code having a status indicating that contactor 40 is stuck-closed. As with step 108, suitable control actions may be taken as needed as part of step 112 after recording this status, for instance repair or replacement of the contactor(s) 40.

At step 114, the controller 50 records, via the diagnostic signal (arrow 60) of FIGS. 1 and 2, a diagnostic code having a status indicating that one of two conditions is present: a shorted/out-of-range high fault (region 72 of FIG. 1) and a shorted/out-of-range low fault (region 74 of FIG. 3) for the voltage sensor(s) 34. Suitable control actions may be taken as needed as part of step 114 after recording this status, for instance repair or replacement of the voltage sensor(s) 34.

At step 116, the controller 50 records, via the diagnostic signal (arrow 60) of FIGS. 1 and 2, a diagnostic having a status indicating that all diagnostics have passed for the contactors 40 and the sensor(s) 34.

While the best modes for carrying out the invention have been described in detail, those familiar with the art to which this invention relates will recognize various alternative designs and embodiments for practicing the invention within the scope of the appended claims.

The invention claimed is:

1. A method comprising:
   driving a voltage sensor with a 5 VDC reference voltage;
   measuring, via the voltage sensor, a voltage between electrical ground and a conductive rail of a voltage bus in an electrical system having a voltage source and an electrical load that is selectively connectable to the voltage source via a contactor, including outputting a voltage signal from the voltage sensor at 0.5 VDC for a measured voltage of 0 VDC and at 4.5 VDC for a measured voltage that is equal to a first threshold voltage;
   receiving the measured voltage from the voltage sensor using a controller when the contactor is open;
   comparing the received measured voltage to the first threshold voltage, wherein the first threshold voltage corresponds to a calibrated voltage reading of the voltage sensor that is expected when the contactor is closed;
   recording a first diagnostic code in a memory device of the controller, thereby indicating a stuck-in-range failure status for the voltage sensor, when the received measured voltage is greater than 0 and less than the first threshold voltage; and
   recording a second diagnostic code in the memory device, thereby indicating a stuck-closed status for the contactor, when the received measured voltage is equal to the first threshold voltage.

2. The method of claim 1, further comprising:
   comparing the received measured voltage to a second threshold voltage that exceeds the first threshold voltage; and
   recording a third diagnostic code in the memory device, thereby indicating a shorted value for the voltage sensor, when the received measured voltage exceeds the first threshold voltage or is less than 0.

3. The method of claim 1, wherein the conductive rail includes a positive and a negative conductive rail, and wherein receiving the measured voltage includes:
 receiving a first voltage from a first voltage sensor positioned between electrical ground and the positive rail; and
 receiving a second voltage from a second voltage sensor positioned between electrical ground and the negative rail.

4. The method of claim 3, further comprising:
 driving the first and second voltage sensors with the 5 VDC reference voltage; and
 outputting, from the first and second voltage sensors, the voltage signal at 0.5 VDC for a measured voltage of 0 VDC and at 2.25 VDC for a measured voltage that is equal to half of the voltage rating of the voltage source.

5. A system comprising:
 a voltage source;
 a voltage bus;
 a contactor;
 an electrical load that is selectively connected to and disconnected from the voltage source over the voltage bus via the contactor;
 a voltage sensor, driven with a 5 VDC reference voltage, that is configured to measure a voltage between electrical ground and a conductive rail of the voltage bus; and
 a controller in communication with the voltage sensor that includes a tangible, non-transitory memory device on which is recorded instructions for isolating an electrical fault in the system, and a processor that executes the instructions, wherein execution of the instructions by the processor causes the controller to:
  receive the measured voltage from the driven voltage sensor when the contactor is open, including outputting a voltage signal from the voltage sensor at 0.5 VDC for a measured voltage of 0 VDC and at 4.5 VDC for a measured voltage that is equal to the first threshold voltage;
  compare the received measured voltage to a first threshold voltage, wherein the first threshold voltage corresponds to a calibrated voltage reading that is expected when the contactor is closed;
  record a first diagnostic code, with a stuck-in-range failure status for the voltage sensor, when the received measured voltage is greater than 0 and less than the first threshold voltage; and
  record a second diagnostic code, with a stuck-closed status for the contactor, when the received measured voltage is equal to the first threshold voltage.

6. The system of claim 5, wherein execution of the instructions by the processor additionally causes the controller to compare the received measured voltage to a second threshold voltage that exceeds the first threshold voltage, and to record a third diagnostic code corresponding to a shorted value for the voltage sensor when the received measured voltage exceeds the first threshold voltage or is less than 0.

7. The system of claim 5, wherein the sensor outputs the voltage signal at 5 VDC for a measured voltage exceeding the maximum output voltage of the voltage source.

8. The system of claim 5, wherein the voltage bus includes positive and negative rails, and the voltage sensor includes a first voltage sensor that measures a first voltage between electrical ground and the positive rail and a second voltage sensor that measures a second voltage between electrical ground and the negative rail.

9. The system of claim 5, wherein the voltage source is a rechargeable battery pack having a maximum output voltage of at least 300 VDC.

10. The system of claim 9, further comprising a motor/generator unit that is electrically connected to the battery pack.

11. A vehicle comprising:
 a battery pack;
 a transmission;
 a motor/generator unit that is coupled to the transmission;
 a voltage bus having a positive and a negative rail;
 a pair of contactors, with a first contactor connected to the positive rail and a second contactor connected to the negative rail;
 a power inverter module that is selectively connected to and disconnected from the battery pack over the voltage bus via the pair of contactors, wherein the power inverter module is responsive to pulse width modulation and high-speed semiconductor switching to convert AC power from the motor/generator unit into DC power suitable for storage in the battery pack, and to convert the DC power stored in the battery pack into AC power for powering the motor/generator unit;
 a first voltage sensor, driven with a 5 VDC reference voltage, that is configured to measure a voltage between electrical ground and the positive rail;
 a second voltage sensor, driven with the 5 VDC reference voltage, that is configured to measure a voltage between electrical ground and the negative rail, wherein the first and second voltage sensors are configured to output a voltage signal at 0.5 VDC for a measured voltage of 0 VDC, at 2.25 VDC for a measured voltage equal to the first threshold voltage, and at 5 VDC for a measured voltage in excess of the first threshold voltage; and
 a controller in communication with the voltage sensors that includes a tangible, non-transitory memory device on which is recorded instructions for isolating an electrical fault in the vehicle, and a processor that executes the instructions, wherein execution of the instructions by the processor causes the controller to:
  receive the measured voltages from the voltage sensors when the pair of contactors is open;
  compare each of the received measured voltages to a first threshold voltage, wherein the first threshold voltage corresponds to an expected voltage reading when the contactors are closed;
  record a first diagnostic code, with a stuck-in-range failure status for one of the voltage sensors, when one of the received measured voltages is greater than 0 and less than the first threshold voltage; and
  record a second diagnostic code, with a stuck-closed status for one of the contactors, when one of the received measured voltages is equal to the first threshold voltage.

12. The vehicle of claim 11, wherein execution of the instructions by the processor additionally causes the controller to compare the received measured voltages to a second threshold voltage that exceeds the first threshold voltage, and to record a third diagnostic code corresponding to a shorted value for one of the voltage sensors when one of the received measured voltages exceeds the first threshold voltage or is less than 0.

13. The vehicle of claim 11, further comprising a resistor and an additional contactor connected in electrical parallel with the contactors, wherein the controller is configured to close the additional contactor prior to closing the contactors so as to limit a rate of current flow into the power inverter module.

* * * * *